(12) United States Patent
Ikedo et al.

(10) Patent No.: US 7,336,934 B2
(45) Date of Patent: Feb. 26, 2008

(54) TRANSMISSION MODULATION APPARATUS

(75) Inventors: Taichi Ikedo, Yokohama (JP); Mamoru Arayashiki, Yokohama (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 471 days.

(21) Appl. No.: 11/074,929

(22) Filed: Mar. 9, 2005

(65) Prior Publication Data
US 2005/0277390 A1 Dec. 15, 2005

(30) Foreign Application Priority Data
Mar. 11, 2004 (JP) .............................. 2004-069435

(51) Int. Cl.
*H04B 1/02* (2006.01)
*H03C 1/52* (2006.01)
(52) U.S. Cl. .................. 455/108; 455/127.1; 455/102; 455/127.4
(58) Field of Classification Search ............. 455/127.1, 455/108, 110, 126, 127.2, 115.1, 115.2, 102, 455/67.11, 67.14, 69, 127.3, 63.13, 116, 118, 455/127.4, 103; 375/297, 300
See application file for complete search history.

(56) References Cited
U.S. PATENT DOCUMENTS
5,847,602 A 12/1998 Su 6,034,990 A * 3/2000 Kang ......................... 455/208
6,249,559 B1 * 6/2001 Jun ............................. 375/376
7,110,730 B2 * 9/2006 Okada et al. ............. 455/127.2
2007/0184797 A1 * 8/2007 Okada et al. ............. 455/127.1

FOREIGN PATENT DOCUMENTS
JP 10256843 9/1998
JP 2002530917 9/2002
WO 0030250 5/2000

* cited by examiner

*Primary Examiner*—Edward F. Urban
*Assistant Examiner*—John J. Lee
(74) *Attorney, Agent, or Firm*—Stevens, Davis, Miller & Mosher, LLP (57) ABSTRACT

Linear transmission modulation apparatus 100 has high frequency amplifier 102 that amplifies the high frequency phase modulation signal of a high frequency signal and power source voltage controller 101 that amplifies the baseband amplitude modulation signal of the high frequency signal. Power source voltage controller 101 has delta sigma amplifier 103 that performs delta sigma amplifying of the baseband amplitude modulation signal and generates a delta sigma amplification signal and delta amplifier 104 that performs delta amplifying of the baseband amplitude modulation signal and generates a delta amplification signal. In response to a modulation mode switching control signal that indicates as to whether or not the amplitude modulation signal fluctuates, one of delta sigma amplifier 103 and delta amplifier 104 operates and sends out an output.

6 Claims, 7 Drawing Sheets

TRANSMISSION MODULATION APPARATUS

BACKGROUND OF THE INVENTION

1. Technical Field

The present invention relates to a transmission modulation apparatus that utilizes polar modulation and is useful in high efficiency linear transmission modulation system.

2. Description of the Related Art

Generally, in the conventional configuration of linear transmission modulation apparatus, there is a tradeoff relationship between efficiency and linearity. However, recently, various techniques are proposed that make possible both high efficiency and linearity in linear transmission modulation apparatus by employing polar modulation.

Figure 1:
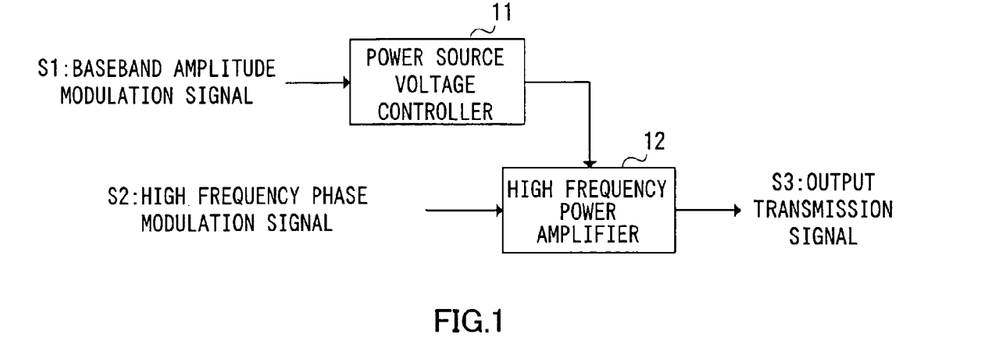
FIG.1 is a block diagram showing a configuration of a conventional linear transmission modulation apparatus.

FIG.1 is a bock diagram showing the configuration of a conventional transmission modulation apparatus employing polar modulation. In this configuration, baseband amplitude modulation signal S1 is inputted in power source voltage controller 11, and its output and high frequency phase modulation signal S2 are combined in high frequency power amplifier 12 and give linear, high frequency transmission modulation signal S3 (output transmission signal).

Power source voltage controller 11 is often implemented using a switch mode power source having a class D amplifier in the output stage for maximum efficiency. Usually, a switch mode power source is implemented utilizing pulse width modulation, and the output of such power source is given in the form of a rectangular wave where the high/low (high level/low level) ratio represents a baseband amplitude modulation signal.

Figure 2:
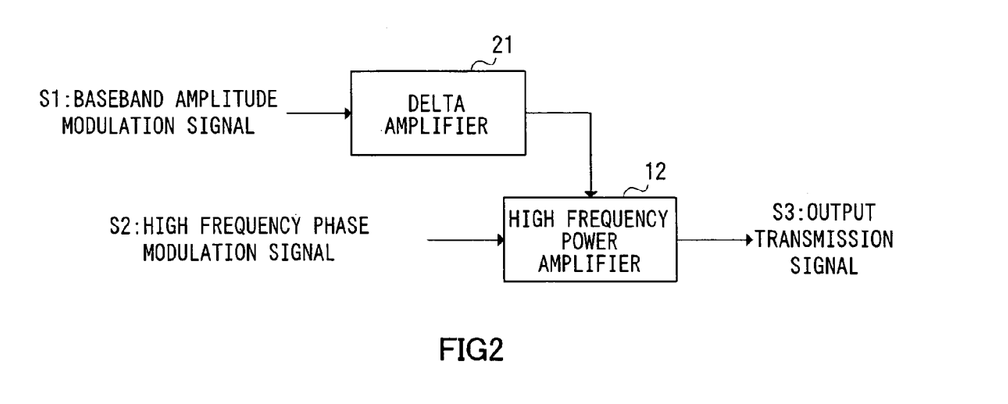
FIG. 2 is a block diagram showing a configuration of another conventional linear transmission modulation apparatus.

However, when amplitude modulation is performed utilizing pulse width modulation such as mentioned above, this creates intermodulation distortion in high frequency output transmission signals. A shown in FIG. 2, a solution to the above problem is to configure a power source voltage controller with delta amplifier 21, delta amplify baseband amplitude modulation signal S1 and supply the result to high frequency power amplifier 12, delta amplify the switch mode power source voltage, and improve the distortion of the high frequency transmission modulation signal by the negative feedback loop of the delta amplification. See, for example, Japanese Patent Publication No. HEI 10-256843 (Paragraphs [0019]-[0023], FIG. 3).

However, delta amplification does not process the DC (direct current) component, and so it is not possible to output fixed voltage (DC component) from the power source voltage controller. That is, the use of delta amplification makes it difficult to give fixed voltage as the power source voltage of high frequency power amplifier. Consequently, for example, if one tries to implement a transmission modulation apparatus that supports various modulation schemes, it is not possible to share a power source voltage controller if there are schemes whereby the amplitude modulation signal does not fluctuate (e.g., GSM scheme). In addition, if amplitude modulation needs to be performed in an early stage of the high frequency power amplifier, the high frequency power amplifier needs to switch from switching operation to linear operation. It is then difficult to give fixed voltage as the source for the high frequency power amplifier.

Figure 3:
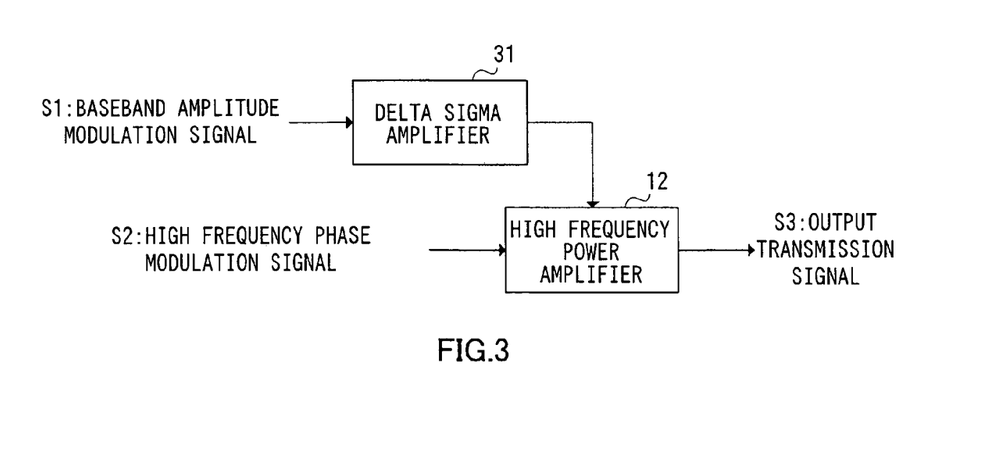
FIG. 3 is a block diagram showing a configuration of another conventional linear transmission modulation apparatus.

As shown in FIG.3, a solution to the above problem is to configure a power source voltage controller with delta sigma amplifier 31, delta sigma amplify baseband amplitude modulation signal S1 and supply the result to high frequency power amplifier 12, and make it possible to transmit the DC component. See, for example, Japanese Patent Publication No.2002-530917 (Paragraphs [0018]-[0024], FIG. 1).

However, the above-mentioned transmission modulation apparatus utilizing delta sigma amplification has the problem that noise concentrates in high frequency domain due to the noise shaping characteristics of delta sigma amplification and the problem of deterioration in spectral characteristics such as adjacent channel leakage power.

SUMMARY OF THE INVENTION

It is therefore an object of the present invention to provide a transmission modulation apparatus that supports various modulation schemes without causing deterioration in spectral characteristics.

A transmission modulation apparatus according to the present invention has a configuration having: a high frequency power amplifier that amplifies a high frequency phase modulation signal of a high frequency signal; and a power source voltage controller that amplifies a baseband amplitude modulation signal of the high frequency signal and controls a power source voltage to the high frequency power amplifier, and, in this transmission modulation apparatus, the power source voltage controller has a delta sigma amplifier that performs delta sigma amplifying of the baseband amplitude modulation signal and generates a delta sigma amplification signal; a delta amplifier that performs delta amplifying of the baseband amplitude modulation signal and generates a delta amplification signal; and a selector that selects one of the delta sigma amplification signal and the delta amplification signal in accordance with a modulation mode switching control signal that indicates whether or not the baseband amplitude modulation signal fluctuates, selecting the delta sigma amplification signal when the baseband amplitude modulation signal does not fluctuate and selecting the delta amplification signal when the baseband amplitude modulation signal fluctuates.

BRIEF DESCRIPTION OF DRAWINGS

The above and other objects and features of the invention will appear more fully hereinafter from a consideration of the following description taken in connection with the accompanying drawings in which.

DETAILED DESCRIPTION OF PREFERRED EMBODIMENTS

Embodiments of the present invention will be described in detail below with reference to the accompanying drawings.

Cases will be described hereinafter where embodiments of the transmission modulation apparatus of the present invention are applied to high efficiency transmission modulation system of transmission apparatus. The linear transmission modulation apparatus of the present embodiment is a linear transmission modulation apparatus for transmission apparatus configured with a polar modulator. This linear transmission modulation apparatus is used, for example, in mobile terminal apparatus with wireless communication apparatus of mobile communication system and base station apparatus that communicate with this mobile terminal apparatus.

Embodiment 1

Figure 4:
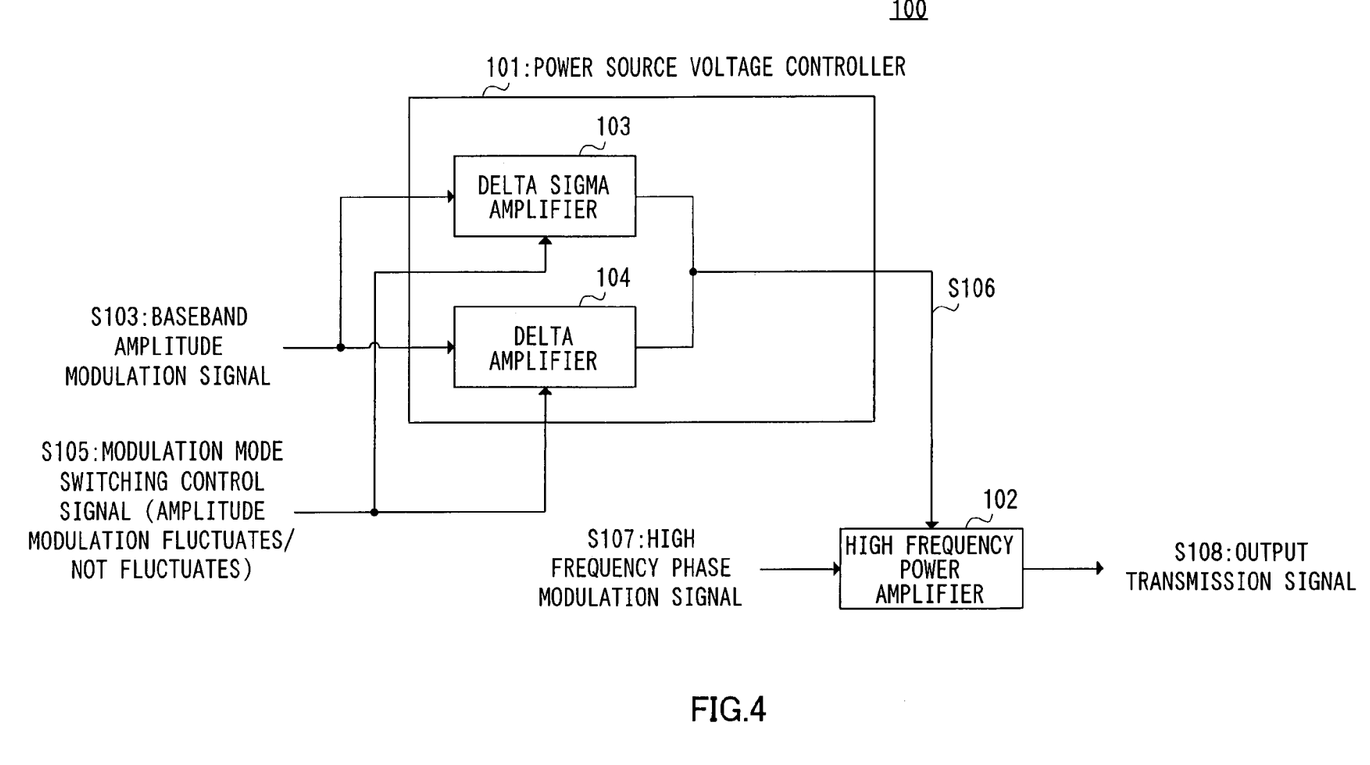
FIG. 4 is a block diagram showing a configuration of a linear transmission modulation apparatus according to Embodiment 1 of the present invention.

Embodiment 1 of the present invention will be now described in detail below with reference to the accompanying drawings. FIG. 4 is a block diagram showing the configuration of a linear transmission modulation apparatus according to Embodiment 1 of the present invention.

As shown in FIG. 4, linear transmission modulation apparatus 100 according to Embodiment 1 of the present invention has power source voltage controller 101 and high frequency amplifier 102. Power source voltage controller 101 has delta sigma amplifier 103 and delta amplifier 104.

Delta sigma amplifier 103 performs delta sigma amplifying of baseband amplitude modulation signal S103 and generates a delta sigma amplification signal. Delta amplifier 104 performs delta amplifying of baseband amplitude modulation signal S103 and generates a delta amplification signal. In response to modulation mode switching control signal S105 that indicates whether or not the amplitude modulation signal fluctuates, delta sigma amplifier 103 and delta amplifier 104 in power source voltage controller 101 send one of the delta sigma amplification signal and the delta amplification signal as output signal S106 of power source voltage controller 101 and as the power source voltage, to high frequency amplifier 102.

That is, in power source voltage controller 101, when modulation mode switching control signal S105 indicates that the amplitude modulation signal fluctuates, delta amplifier 104 alone operates in response to this modulation mode switching control signal S105 and sends the delta amplification signal to high frequency amplifier 102 as output signal S106. On the other hand, in power source voltage controller 101, when modulation mode switching control signal S105 indicates that the amplitude modulation signal does not fluctuate, delta sigma amplifier 103 alone operates in response to modulation mode switching control signal S105 and sends the delta sigma amplification signal to high frequency amplifier 102 as output signal S106.

In response to output signal S106, high frequency amplifier 102 amplifies high frequency phase modulation signal S107 that is inputted, and generates and outputs output transmission signal S108. Thus, when the amplitude modulation signal fluctuates, linear transmission modulation apparatus 100 according to Embodiment 1 of the present invention performs delta amplifying of baseband amplitude modulation signal S103, generates a delta amplification signal, and sends this signal to high frequency amplifier 102. On the other hand, when the amplitude modulation signal does not fluctuate, linear transmission modulation apparatus 100 according to Embodiment 1 of the present invention performs delta sigma amplifying of baseband amplitude modulation signal S103, generates a delta sigma amplification signal, and sends this signal to high frequency amplifier 102.

As a result, provided that delta amplification has no noise shaping characteristics and therefore does not cause deterioration in spectral characteristics and that delta sigma amplification does not cause the baseband amplitude modulation signal to fluctuate, linear transmission modulation apparatus 100 needs only to amplify the DC component and therefore makes the sampling frequency required by delta sigma amplification less than the sampling frequency required by delta amplification and reduces power consumption. Less power consumption may make it possible to make the apparatus even smaller. Moreover, regarding the noise shaping characteristics of delta sigma amplification, provided that the DC component alone needs to be amplified, the noise shaping characteristics can be eliminated using a low pass filter having a low enough cutoff frequency, so that linear transmission modulation apparatus 100 is able to support various modulation schemes without causing deterioration in spectral characteristics.

Embodiment 2

Figure 5:
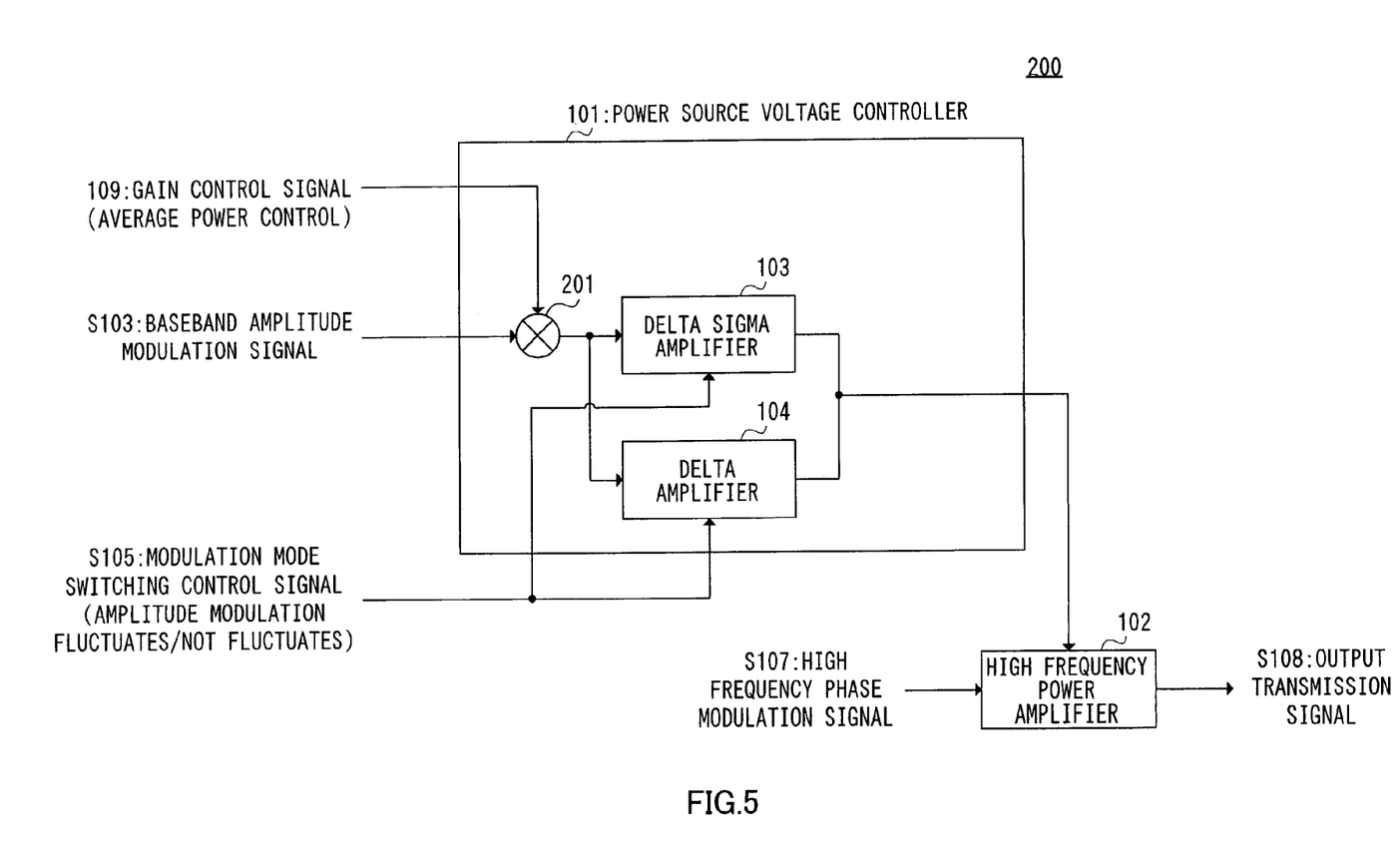
FIG. 5 is a block diagram showing a configuration of a linear transmission modulation apparatus according to Embodiment 2 of the present invention.

Next, Embodiment 2 of the present invention will be described in detail with reference to the accompanying drawings. FIG. 5 is a block diagram showing the configuration of a linear transmission modulation apparatus according to Embodiment 2 of the present invention. Parts in Embodiment 2 of the present invention that are identical to ones in Embodiment 1 of the present invention will be assigned the same reference numerals as in Embodiment 1 without further explanations.

As shown in FIG. 5, linear transmission modulation apparatus 200 according to Embodiment 2 of the present invention has the configuration of Embodiment 1 of the present invention with an addition of multiplier 201. That is, linear transmission modulation apparatus 200 has power source voltage controller 101 and high frequency amplifier 102. Power source voltage controller 101 has delta sigma amplifier 103, delta amplifier 104 and multiplier 201.

Multiplier 201 multiplies the value (voltage value) of baseband amplitude modulation signal S103 and the value (voltage value) of gain control signal S109, generates a gain control amplitude modulation signal, and sends this signal to delta sigma amplifier 103 and delta amplifier 104. Other configurations and operations of linear transmission modulation apparatus 200 are the same as in Embodiment 1 of the present invention. Hereinafter the value of a signal will mean the voltage value of the signal. Still, the value of a signal is by no means limited to its voltage value and can be its current value as well.

Embodiment 2 of the present invention has the same advantages as those of Embodiment 1 of the present invention. Embodiment 2 further has an additional advantage of controlling the output level of output transmission signals by sending gain control signal S109 to multiplier 201 that specifies the gain of high frequency amplifier 102.

Embodiment 3

Figure 6:
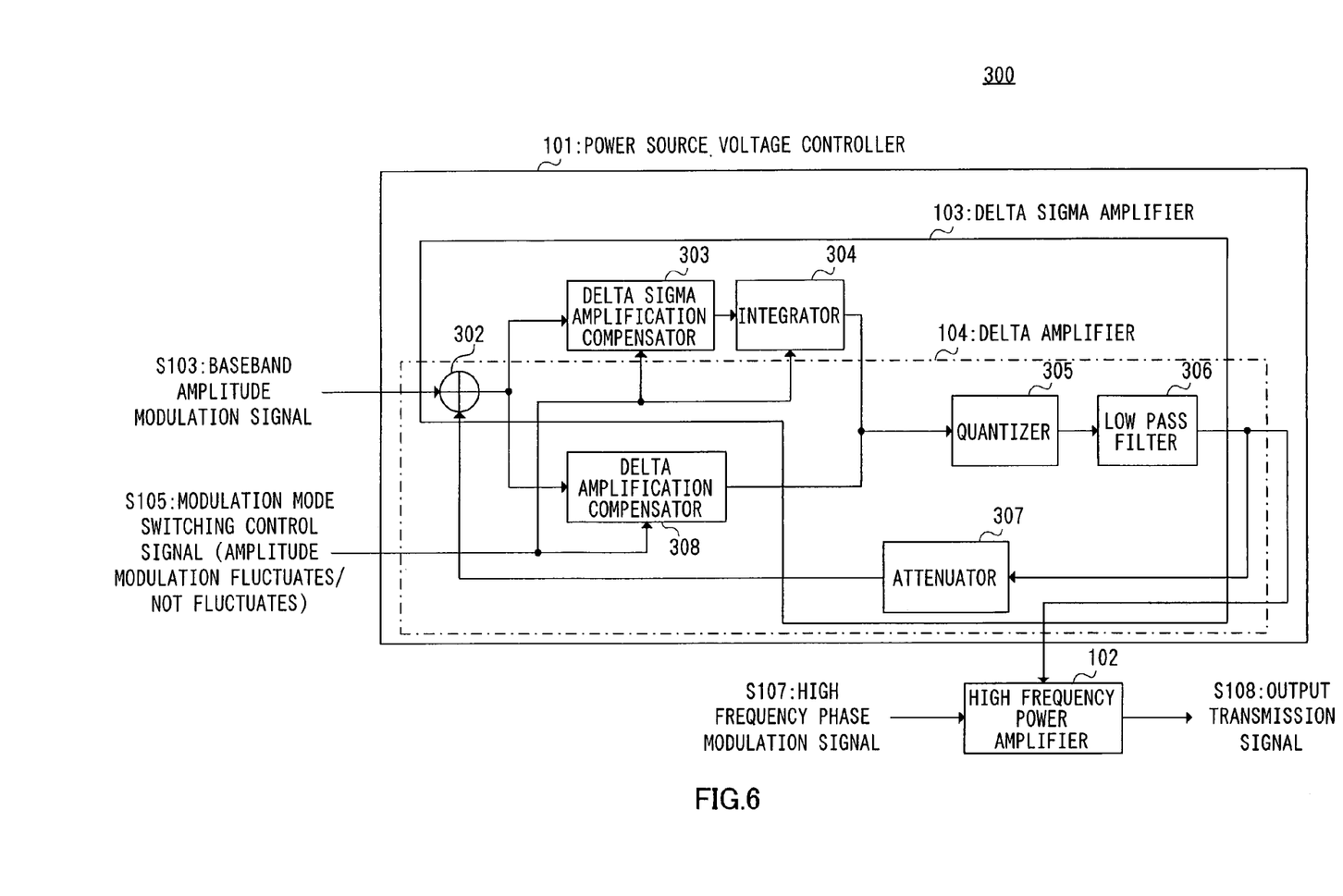
FIG. 6 is a block diagram showing a configuration of a linear transmission modulation apparatus according to Embodiment 3 of the present invention.

Next, Embodiment 3 of the present invention will be described below in detail with reference to the accompanying drawings. FIG. 6 is a block diagram showing the configuration of a linear transmission modulation apparatus according to Embodiment 3 of the present invention. Parts in Embodiment 3 of the present invention that are identical to ones in Embodiment 1 of the present invention will be assigned the same reference numerals as in Embodiment 1 without further explanations.

As shown in FIG. 6, linear transmission modulation apparatus 300 according to Embodiment 3 of the present invention has power source voltage controller 101 and high frequency amplifier 102. Power source voltage controller 101 has delta sigma amplifier 103 and delta amplifier 104.

Delta sigma amplifier 103 has adder 302, delta sigma amplification compensator 303, integrator 304, quantizer 305, low pass filter 306 and attenuator 307. Delta amplifier 104 has adder 302, delta amplification compensator 308, quantizer 305, low pass filter 306 and attenuator 307. Delta sigma amplifier 103 and delta amplifier 104 share adder 302, quantizer 305, low pass filter 306 and attenuator 307. In response to modulation mode switching control signal S105, one of the output of integrator 304 and the output signal of delta amplification compensator 308 is sent out as an output signal.

That is, when modulation mode switching control signal S105 indicates that the-amplitude modulation signal fluctuates, delta amplification compensator 308 operates in response to this modulation mode switching control signal S105, and delta sigma amplification compensator 303 and integrator 304 do not operate. At this time delta amplification compensator 308 sends an output signal to quantizer 305. On the other hand, when modulation mode switching control signal S105 indicates that the amplitude modulation signal does not fluctuate, delta sigma amplification compensator 303 and integrator 304 operate in response to this modulation mode switching control signal S105, and delta amplification compensator 308 does not operate. At this time, integrator 304 sends an output signal to quantizer 305.

First, the operation in the case where modulation mode switching control signal S105 indicates that the amplitude modulation signal does not fluctuate will be described in detail with reference to the accompanying drawings.

When modulation mode switching control signal S105 indicates that the amplitude modulation signal does not fluctuate, delta sigma amplification compensator 303 and integrator 304 operate in response to this modulation mode switching control signal S105, and delta amplification compensator 308 does not operate. Adder 302 receives baseband amplitude modulation signal S103 and in addition receives a negative feedback signal from low pass filter 306 via attenuator 307. Adder 302 adds the value of baseband amplitude modulation signal S103 and the value of the negative feedback signal.

Delta sigma amplification compensator 303 compensates the output of adder 302. Integrator 304 integrates the output of delta sigma amplification compensator 303 and sends an output signal to quantizer 305.

Quantizer 305 quantizes the output signal of integrator 304 in accordance with a predetermined threshold. Low pass filter 306 eliminates the quantization noise from the output of quantizer 305. Attenuator 307 adjusts the signal level of the negative feedback signal sent to adder 302 from low pass filter 306. The negative feedback signal is one of the output signal of low pass filter 306 and is part of the output of low pass filter 306. Delta sigma amplification compensator 303 has one of reverse characteristics of low pass filter 306 and characteristics substantially equal to the reverse characteristics of low pass filter 306.

To improve the distortion that is produced in low pass filter 306, delta sigma amplification compensator 303 is designed such that delta sigma amplification compensator 303 operates correctly even if low pass filter 306 is provided in the negative feedback loop of delta sigma amplification. To be more specific, when low pass filter 306 is a low pass filter of a two-dimensional low pass filter, delta sigma amplification compensator 303 has one of reverse characteristics of a two-dimensional low pass filter and characteristics that are substantially equal to reverse characteristics of a two-dimensional low pass filter.

Next, the operation in the case where modulation mode switching control signal S105 indicates that the amplitude modulation signal fluctuates, will be described below in detail with reference to the accompanying drawings. When modulation mode switching control signal S105 indicates that the amplitude modulation signal fluctuates, delta amplification compensator 308 operates in response to this modulation mode switching control signal S105, and delta sigma amplification compensator 303 and integrator 304 do not operate. Adder 302 receives baseband amplitude modulation signal S103 and in addition receives a negative feedback signal from low pass filter 306 via attenuator 307. Adder 302 adds the value of baseband amplitude modulation signal S103 and the value of the negative feedback signal.

Delta amplification compensator 308 compensates the output of adder 302. The output of delta amplification compensator 308 is sent out as an output signal.

Quantizer 305 quantizes the output of delta amplification compensator 308 in accordance with a predetermined threshold. Low pass filter 306 eliminates the quantization noise from the output of quantizer 305. Attenuator 307 adjusts the signal level of the negative feedback signal sent to adder 302 from low pass filter 306.

The negative feedback signal is one of the output signal of low pass filter 306 and is part of the output of low pass filter 306. Delta amplification compensator 308 has one of reverse characteristics of a low pass filter that is one dimension lower than low pass filter 306 and characteristics substantially equal to reverse characteristics of a low pass filter that is one dimension lower than low pass filter 306. To improve the distortion that is produced in low pass filter 306, delta amplification compensator 308 is designed such that delta amplification compensator 308 operates correctly even if low pass filter 306 is provided in the negative feedback loop of delta sigma amplification. To be more specific, if low pass filter 306 is a two-dimensional low pass filter, delta amplification compensator 308 has one of reverse characteristics of a one-dimensional low pass filter and characteristics similar to reverse characteristics of a one dimensional low pass filter.

Embodiment 3 of the present invention can be configured such that delta sigma amplifier 103 and delta amplifier 104 share at least one of adder 302, quantizer 305, low pass filter 306 and attenuator 307.

Embodiment 3 of the present invention has the same advantages as those of Embodiment 1 of the present invention. Embodiment 3 further has an additional advantage of reducing the distortion that is produced in low pass filter 306 by the negative feedback loop of power source voltage controller 101 and delta amplifier 104 and improving signal quality. In addition, by configuring Embodiment 3 of the present invention such that delta sigma amplifier 103 and delta amplifier 104 share at least one of adder 302, quantizer 305, low pass filter 306 and attenuator 307, it is possible to simplify the configuration and reduce the cost.

Embodiment 4

Figure 7:
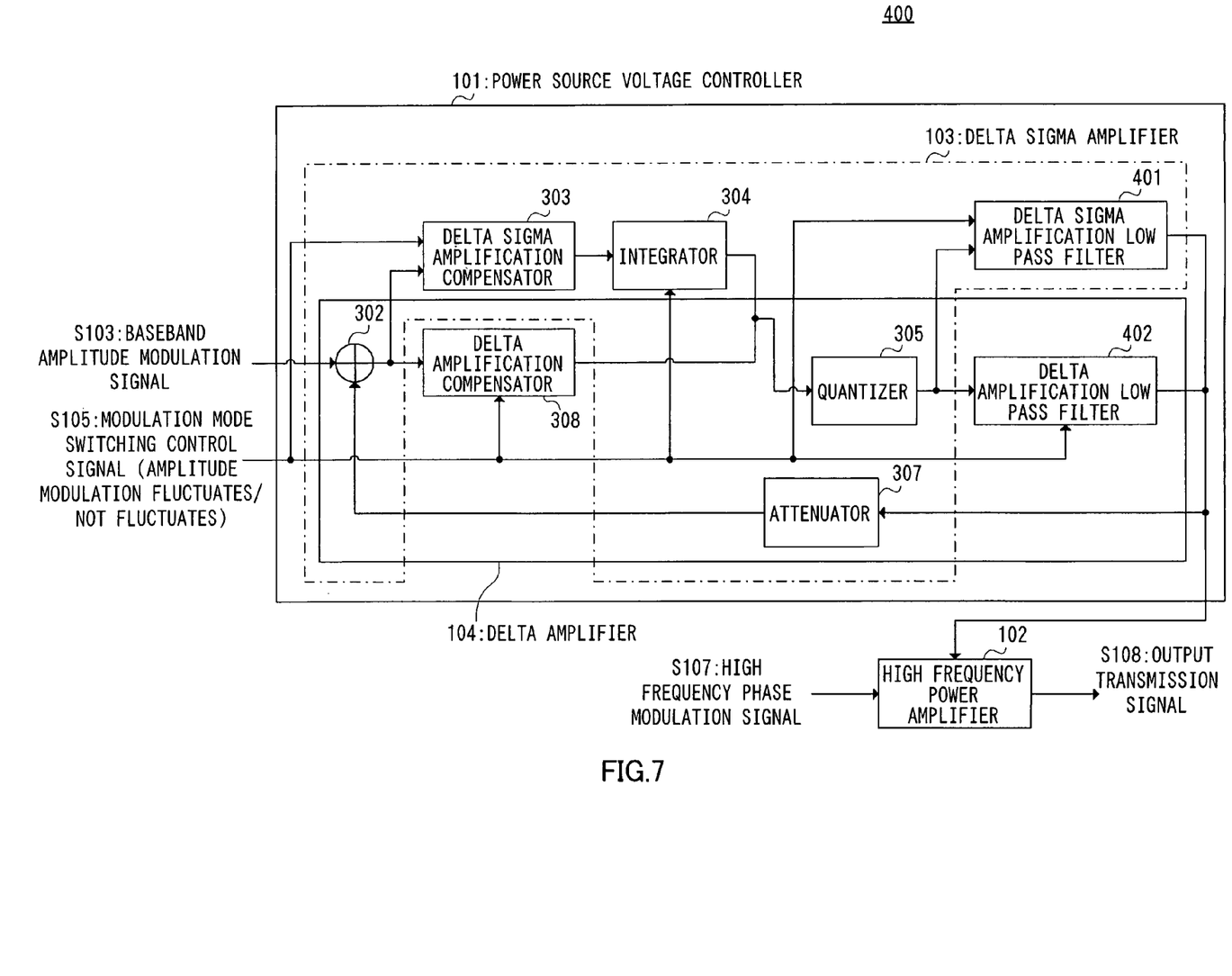
FIG. 7 is a block diagram showing a configuration of a linear transmission modulation apparatus according to Embodiment 4 of the present invention.

Next, Embodiment 4 of the present invention will be described in detail below with reference to the accompanying drawings. FIG. 7 is a block diagram showing the configuration of a linear transmission modulation apparatus according to Embodiment 4 of the present invention. Parts in Embodiment 4 of the present invention that are identical to ones in Embodiment 3 of the present invention will be assigned the same reference numerals as in Embodiment 3 without further explanations.

As shown in FIG. 7, linear transmission modulation apparatus 400 according to Embodiment 4 of the present invention has power source voltage controller 101 and high frequency amplifier 102. Power source voltage controller 101 has delta sigma amplifier 103 and delta amplifier 104. Power source voltage controller 101 of linear transmission modulation apparatus 400 according to Embodiment 4 of the present invention has the configuration of Embodiment 3 of the present invention, with delta sigma amplification low pass filter 401 and delta amplification low pass filter 402 in place of low pass filter 306.

Delta sigma amplifier 103 has adder 302, delta sigma amplification compensator 303, integrator 304, quantizer 305, delta sigma amplification low pass filter 401 and attenuator 307. Delta amplifier 104 has adder 302, delta amplification compensator 308, quantizer 305, delta amplification low pass filter 402 and attenuator 307. Delta sigma amplifier 103 and delta amplifier 104 share adder 302, quantizer 305 and attenuator 307.

Delta sigma amplification low pass filter 401 and delta amplification low pass filter 402 each receive a signal from quantizer 305 and send an output signal to attenuator 307.

When modulation mode switching control signal S105 indicates that the amplitude modulation signal fluctuates, delta amplification compensator 308 and delta amplification low pass filter 402 operate in response to this modulation mode switching control signal S105, and delta sigma amplification compensator 303, integrator 304 and delta sigma amplification low pass filter 401 do not operate.

On the other hand, when modulation mode switching control signal S105 indicates that the amplitude modulation signal does not fluctuate, delta sigma amplification compensator 303, integrator 304 and delta sigma amplification low pass filter 401 operate in response to this modulation mode switching control signal S105 and delta amplification compensator 308 and delta amplification low pass filter 402 do not operate.

Embodiment 4 of the present invention can be configured such that delta sigma amplifier 103 and delta amplifier 104 share at least one of adder 302, quantizer 305 and attenuator 307.

Embodiment 3 of the present invention has the same advantages as those of Embodiment 1 of the present invention. Embodiment 4 further has an additional advantage of making the cutoff frequency of delta sigma amplification low pass filter 401 lower than that of delta amplification low pass filter 402, thereby eliminating the noise shaping characteristics of delta sigma amplification more effectively than the configuration of FIG. 6 and reducing power consumption. Less power consumption may make it possible to make the apparatus even smaller.

Embodiment 5

Figure 8:
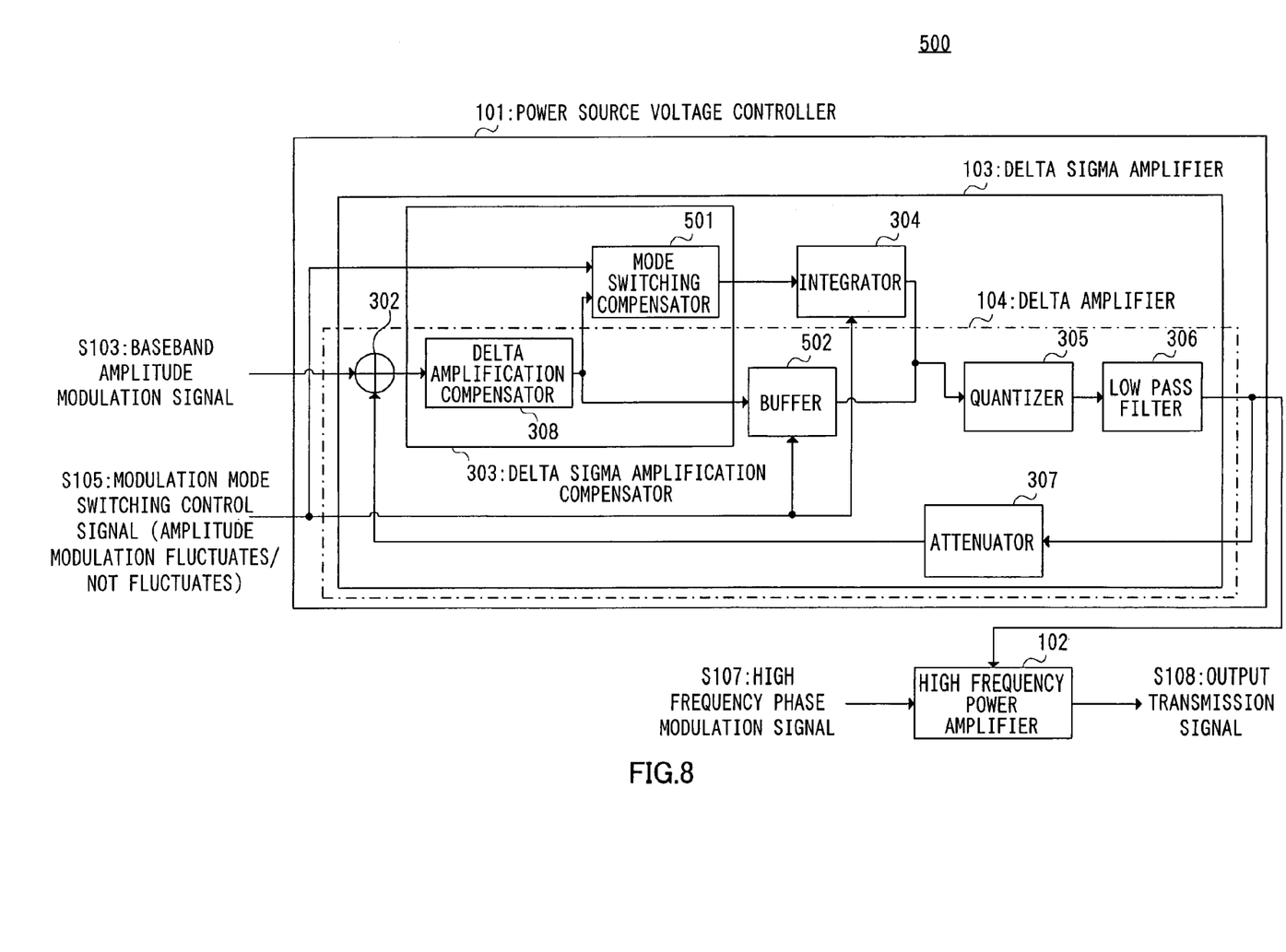
FIG. 8 is a block diagram showing a configuration of a linear transmission apparatus according to Embodiment 5 of the present invention.

Next, Embodiment 5 of the present invention will be described in detail with reference to the accompanying drawings. FIG. 8 is a block diagram showing the configuration of a linear transmission modulation apparatus according to Embodiment 5 of the present invention. Parts in Embodiment 5 of the present invention that are identical to one in Embodiment 3 of the present invention will be assigned the same reference numerals as in Embodiment 3 without further explanations.

As shown in FIG. 8, linear transmission modulation apparatus 500 according to Embodiment 5 of the present invention has power source voltage controller 101 and high frequency amplifier 102. Power source voltage controller 101 has delta sigma amplifier 103 and delta amplifier 104.

Delta sigma amplifier 103 has adder 302, delta amplification compensator 308, mode switching compensator 501, integrator 304, quantizer 305, low pass filter 306 and attenuator 307. Delta amplifier 104 has adder 302, delta amplification compensator 308, buffer 502, quantizer 305, low pass filter 306 and attenuator 307. Delta sigma amplifier 103 and delta amplifier 104 share delta amplification compensator 308, adder 302, quantizer 305, low pass filter 306 and attenuator 307.

In Embodiment 5 of the present invention, delta sigma amplification compensator 303 of Embodiment 3 of the present invention is configured with delta amplification compensator 308 and mode switching compensator 501.

In response to modulation mode switching control signal S105, one of the output of integrator 304 and the output of buffer 502 is sent to quantizer 305 as an output signal.

That is, when modulation mode switching control signal S105 indicates that the amplitude modulation signal fluctuates, buffer 502 operates in response to this modulation mode switching control signal S105, and mode switching compensator 501 and integrator 304 do not operate. At this time, buffer 502 sends an output signal to quantizer 305.

On the other hand, when modulation mode switching control signal S105 indicates that the amplitude modulation signal does not fluctuate, mode switching compensator 501 and integrator 304 operate in response to modulation mode switching control signal S105, and buffer 502 does not operate. At this time, integrator 304 sends an output signal to quantizer 305.

Mode switching compensator 501 compensates the output of delta amplification compensator 308 so as to make it equal to the output of delta sigma amplification compensator 303, and sends the result to integrator 304. To be more specific, when low pass filter 306 is a two-dimensional low pass filter, delta sigma amplification compensator 303 has one of reverse characteristics of this two-dimensional low pass filter and characteristics substantially equal to reverse characteristics of the two-dimensional filter, and delta amplification compensator 308 has one of reverse characteristics of a one-dimensional filter and characteristics substantially equal to reverse characteristics of a one-dimensional filter. Other configurations and operations of Embodiment 5 of the present invention are the same as in Embodiment 3 of the present invention.

Embodiment 5 of the present invention can be configured such that delta sigma amplifier 103 and delta amplifier 104 share at least one of delta amplification compensator 308, adder 302, quantizer 305, low pass filter 306 and attenuator 307.

Embodiment 5 of the present invention has the same advantages as those of Embodiment 1 of the present invention. Embodiment 5 further has an additional advantage of reducing the distortion that is produced in low pass filter 306 by the negative feedback loop of delta sigma amplifier 103 and delta amplifier 104 and improving signal quality. In addition, by configuring Embodiment 5 of the present invention such that delta sigma amplifier 103 and delta amplifier 104 share at least one of delta amplification compensator 308, adder 302, quantizer 305 and attenuator 307, it is possible to simplify the configuration and reduce the cost.

Embodiment 6

Figure 9:
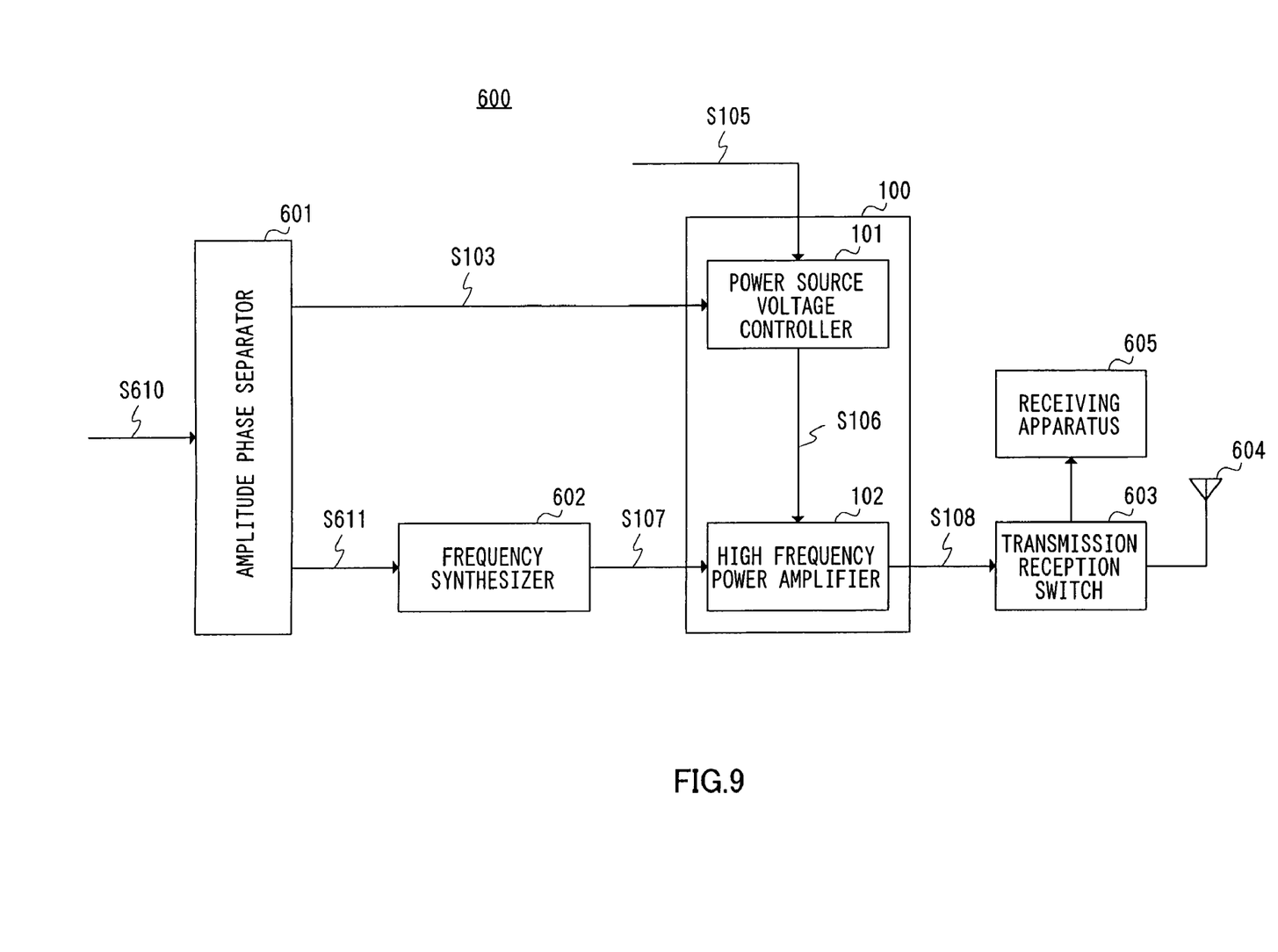
FIG. 9 is a block diagram showing a configuration of a wireless communication apparatus according to Embodiment 6 of the present invention.

Next, Embodiment 6 of the present invention will be described in detail with reference to the accompanying drawings. FIG. 9 is a block diagram showing the configuration of a wireless communication apparatus according to Embodiment 6 of the present invention. Parts in Embodiment 6 of the present invention that are identical to ones in Embodiment 1 of the present invention will be assigned the same reference numerals as in Embodiment 1 without further explanations.

As shown in FIG. 9, linear transmission modulation apparatus 600 according to Embodiment 6 of the present invention has amplitude phase separator 601, linear transmission modulation apparatus 100, frequency synthesizer 602, transmission and reception switch 603, antenna 604 and receiving apparatus 605. Linear transmission modulation apparatus 100 has power source voltage controller 101 and high frequency amplifier 102.

Amplitude phase separator 601 receives and divides baseband modulation signal S610 and generates baseband amplitude modulation signal S103 and baseband phase modulation signal S611. As mentioned earlier, power source voltage controller 101 receives base band amplitude modulation signal S103 and modulation mode switching control signal S105 and sends output signal S106 to high frequency amplifier 102 as the power source voltage.

Frequency synthesizer 602 receives baseband phase modulation signal S611 and modulates phase of the carrier signal by baseband phase modulation signal S611 and generates high frequency phase modulation signal S107 and sends it to high frequency amplifier 102. In response to output signal (power source voltage) S106 of power source voltage controller 101, high frequency amplifier 102 modulates (amplifies) amplitude of high frequency phase modulation signal S107 from frequency synthesizer 602 and generates an output transmission signal.

Transmission and reception switch 603 receives the output transmission signal from high frequency amplifier 102 and sends it to antenna 604. Antenna 604 receives the output signal of transmission and reception switch 603, and generates and transmits a wireless transmission signal. In addition, antenna 604 receives the radio transmission signal from the wireless communication apparatus of the communicating party, generates the received signal, and sends it to transmission and reception switch 603. Transmission and reception switch 603 sends the received signal from antenna 604 to receiving apparatus 605.

Embodiment 6 of the present invention can be configured to have one of linear transmission modulation apparatus 200, 300, 400 and 500 instead of linear transmission modulation apparatus 100.

Embodiment 6 of the present invention can be thus configured with any of the transmission modulation apparatus according to the above-described embodiments of the present invention, thus making possible wireless communication apparatus that supports various modulation schemes, low costs, smaller configuration, and high quality.

The present invention is by no means limited to Embodiments 1 to 6 described above, and various changes and modifications can be made without departing from the scope of the present invention.

A transmission modulation apparatus in accordance with a first aspect of the present invention employs a configuration having: a high frequency power amplifier that amplifies a high frequency phase modulation signal of a high frequency signal; and a power source voltage controller that amplifies a baseband amplitude modulation signal of the high frequency signal and controls a power source voltage to the high frequency power amplifier, and, in this transmission modulation apparatus, the power source voltage controller has: a delta sigma amplifier that performs delta sigma amplifying of the baseband amplitude modulation signal and generates a delta sigma amplification signal; a delta amplifier that performs delta amplifying of the baseband amplitude modulation signal and generates a delta amplification signal; and a selector that selects one of the delta sigma amplification signal and the delta amplification signal in accordance with a modulation mode switching control signal that indicates whether or not the baseband amplitude modulation signal fluctuates, selecting the delta sigma amplification signal when the baseband amplitude modulation signal does not fluctuate and selecting the delta amplification signal when the baseband amplitude modulation signal fluctuates.

According to this configuration, one of the delta sigma amplification signal and the delta amplification signal is sent our as the output signal in accordance with the modulation mode switching control signal, so that delta amplification has no noise shaping characteristics and causes no deterioration in spectral characteristics. In addition, according to this configuration, the baseband amplitude modulation signal does not fluctuate in delta sigma amplification and only the DC component needs to be amplified, so that it is possible to make the sampling frequency required by delta sigma amplification less than the sampling frequency required by delta amplification and reduces power consumption. Furthermore, according to this configuration, noise shaping characteristics can be eliminated by means of a low pass filter with a low enough cutoff frequency.

This configuration consequently supports various modulation schemes.

A transmission modulation apparatus in accordance with a second aspect of the present invention employs a configuration in which, in the first aspect of the present invention, the power source voltage controller comprises a multiplier that multiplies a value of the baseband amplitude modulation signal and a value of a gain control signal and generates a gain control amplitude modulation signal, and sends the gain control amplitude modulation signal to the delta sigma amplifier and the delta amplifier.

This configuration maintains the advantages of the first aspect of the present invention. In addition, by utilizing a gain control signal that specifies the gain of the high frequency power amplifier in the multiplier, this configuration makes it possible to control the output level of the output transmission signal.

A transmission modulation apparatus in accordance with a third aspect of the present invention employs a configuration in which, in the first aspect of the present invention, the delta sigma amplifier has an adder that adds the baseband amplitude modulation signal and a negative feedback signal; a delta sigma amplification compensator that compensates an output of the adder; an integrator that integrates an output of the delta sigma amplification compensator; a quantizer that quantizes an output of the integrator in accordance with a predetermined threshold; and a low pass filter that eliminates quantization noise from an output of the quantizer; the negative feedback signal is one of an output of the low pass filter and part of the output of the low pass filter; the delta sigma amplification compensator has one of reverse characteristics of the low pass filter and characteristics substantially equal to the reverse characteristics; the delta amplifier has: an adder that adds a value of the baseband amplitude modulation signal and a value of the negative feedback signal; a delta amplification compensator that compensates an output of the adder; a quantizer that quantizes an output of the delta amplification compensator in accordance with a predetermined threshold; and a low pass filter that eliminates quantization noise from an output of the quantizer; the negative feedback signal is an output of the low pass filter or part of the output of the low pass filter; and the delta amplification compensator has one of reverse characteristics of a low pass filter that is one dimension lower than the low pass filter and characteristics that are substantially equal to the reverse characteristics.

This configuration maintains the advantages of the first aspect of the present invention. In addition, this configuration makes it possible to reduce the distortion that is produced in the low pass filter by means of the negative feedback loop of the delta sigma amplifier and the delta amplifier and improve signal quality. A transmission modulation apparatus in accordance with a fourth aspect of the present invention employs a configuration in which, in the third aspect of the present invention, the selector selects one of the output of the integrator in the delta sigma amplifier and the output of the delta amplification compensator in the delta amplifier, and the delta sigma amplifier and the delta amplifier share at least one of the adder, the quantizer, and the low pass filter.

This configuration maintains the advantages of the third aspect of the present invention. In addition, in this configuration, the delta sigma amplifier and delta amplifier share at least one of the adder, quantizer, and low pass filer, thereby making possible simpler configurations reduced cost.

A transmission modulation apparatus in accordance with a fifth aspect of the present invention employs a configuration in which, in the third or fourth aspect of the present invention, the delta sigma amplification compensator has the delta amplification compensator and a mode switching compensator provided between the delta amplification compensator and the integrator, the mode switching compensator compensates the output of the delta amplification compensator so as to make the output of the delta sigma amplification compensator substantially equal to the output of the delta sigma amplification compensator, and the delta sigma amplifier and the delta amplifier share the delta amplification compensator.

This configuration maintains the advantages of one of the third and fourth aspects of the present invention. In addition, in this configuration, the delta sigma amplifier and the delta amplifier share the delta amplification compensator, thereby making possible simpler configurations and reduced cost.

A transmission modulation apparatus in accordance with a sixth aspect of the present invention employs a configuration having: the transmission modulation apparatus of one of the first to fifth aspects of the present invention; a receiving apparatus that demodulates a received signal; an antenna; and a transmission and reception switch that switches between supplying a transmission signal from the transmission modulation apparatus to the antenna and supplying the received signal from the antenna to the receiving apparatus.

This configuration makes possible a high quality wireless communication apparatus that supports various modulation schemes and that realizes low cost and smaller configuration.

The present invention is not limited to the above described embodiments, and various variations and modifications may be possible without departing from the scope of the present invention.

This present application is based on Japanese Patent Application No. 2004-069435 filed on Mar. 11, 2004, the entire content of which is expressly incorporated by reference herein.

INDUSTRIAL APPLICABILITY

The transmission modulation apparatus of the present invention has the advantage of supporting various modulation schemes without causing deterioration in spectral characteristics, and is suitable for use in transmission modulation apparatus utilizing polar modulation that is applicable to high efficiency linear transmission modulation system.

The invention claimed is:
1. A transmission modulation apparatus comprising:
a high frequency power amplifier that amplifies a high frequency phase modulation signal of a high frequency signal; and
a power source voltage controller that amplifies a baseband amplitude modulation signal of the high frequency signal and controls a power source voltage of the high frequency power amplifier, wherein
the power source voltage controller comprises:
a delta sigma amplifier that performs delta sigma amplifying of the baseband amplitude modulation signal and generates a delta sigma amplification signal;
a delta amplifier that performs delta amplifying of the baseband amplitude modulation signal and generates a delta amplification signal; and
a selector that selects the delta sigma amplification signal when the baseband amplitude modulation signal does not fluctuate and selects the delta amplification signal when the baseband amplitude modulation signal fluctuates in accordance with a modulation mode switching control signal that indicates whether or not the baseband amplitude modulation signal fluctuates.

2. The transmission modulation apparatus of claim 1, wherein the power source voltage controller comprises a multiplier that multiplies a value of the baseband amplitude modulation signal and a value of a gain control signal and generates a gain control amplitude modulation signal, and sends the gain control amplitude modulation signal to the delta sigma amplifier and the delta amplifier.

3. The transmission modulation apparatus of claim 1, wherein the delta sigma amplifier comprises:
an adder that adds the baseband amplitude modulation signal and a negative feedback signal;
a delta sigma amplification compensator that compensates an output of the adder;

an integrator that integrates an output of the delta sigma amplification compensator;

a quantizer that quantizes an output of the integrator in accordance with a predetermined threshold; and a low pass filter that eliminates quantization noise from an output of the quantizer;

wherein the negative feedback signal is one of an output of the low pass filter and part of said output of the low pass filter;

wherein the delta sigma amplification compensator has one of reverse characteristics of the low pass filter and characteristics substantially equal to reverse characteristics;

wherein the delta amplifier comprises:

an adder that adds a value of the baseband amplitude modulation signal and a value of the negative feedback signal;

a delta amplification compensator that compensates an output of the adder;

a quantizer that quantizes an output of the delta amplification compensator in accordance with a predetermined threshold; and a low pass filter that eliminates quantization noise from an output of the quantizer;

wherein the negative feedback signal is one of an output of the low pass filter and part of said output of the low pass filter; and wherein the delta amplification compensator has one of reverse characteristics of a low pass filter that is one dimension lower than the low pass filter and characteristics that are substantially equal to reverse characteristics.

4. The transmission modulation apparatus of claim 3, wherein the selector selects one of the output of the integrator in the delta sigma amplifier and the output of the delta amplification compensator in the delta amplifier; and wherein the delta sigma amplifier and the delta amplifier share at least one of the adder, the quantizer, and the low pass filter.

5. The transmission modulation apparatus of claim 3, wherein the delta sigma amplification compensator comprises the delta amplification compensator and a mode switching compensator provided between the delta amplification compensator and the integrator; and wherein the mode switching compensator compensates the output of the delta amplification compensator so as to make said output of the delta sigma amplification compensator substantially equal to the output of the delta sigma amplification compensator; and the delta sigma amplifier and the delta amplifier share the delta amplification compensator.

6. A wireless communication apparatus comprising:

the transmission modulation apparatus of claim 1;

a receiving apparatus that demodulates a received signal;

an antenna; and a transmission and reception switch that switches between supplying a transmission signal from the transmission modulation apparatus to the antenna and supplying the received signal from the antenna to the receiving apparatus.

* * * * *